(12) United States Patent
Huang et al.

(10) Patent No.: US 7,134,106 B2
(45) Date of Patent: Nov. 7, 2006

(54) METHOD AND SYSTEM FOR PROVIDING FAST DESIGN FOR TESTABILITY PROTOTYPING IN INTEGRATED CIRCUIT DESIGNS

(75) Inventors: Steve C. Huang, Saratoga, CA (US); Yong Fan, Fremont, CA (US); Ihao Chen, San Jose, CA (US)

(73) Assignee: Incentia Design Systems Corp., Hsinchu (TW)

( * ) Notice: Subject to any disclaimer, the term of this patent is extended or adjusted under 35 U.S.C. 154(b) by 190 days.

(21) Appl. No.: 10/821,505

(22) Filed: Apr. 9, 2004

(65) Prior Publication Data

US 2005/0228616 A1    Oct. 13, 2005

(51) Int. Cl.
*G06F 11/00* (2006.01)
*G06F 17/50* (2006.01)

(52) U.S. Cl. .................... 716/4; 716/6; 702/181
(58) Field of Classification Search ............ 716/4, 716/5, 6; 702/181
See application file for complete search history.

(56) References Cited

U.S. PATENT DOCUMENTS 5,903,466 A * 5/1999 Beausang et al. ............. 716/18
6,505,316 B1 * 1/2003 Chakradhar et al. ......... 714/726
6,697,982 B1 * 2/2004 Chakravarthy et al. ..... 714/738

OTHER PUBLICATIONS

Derek L Beatty et al., Formally Verifying A Microprocessor Using a Simulation Methodology, 1994, 31st ACM/IEEE Design Automation Conference, pp. 596-602.

Alfred Kolbl et al., Symbolic RTL Simulation, 2001, DAC 2001, pp. 47-52.

Sriram C. Krishnan et al., Symbolic Simulatino Formally Verifies ECC, Apr. 2, 2002, EEdesign.

ACCULOGIC Web page, Boundary Scan, 2003.

JTAG Technologies Web page, Unlocking the power of Boundary-scan, 2001.

Marcus Hedlund, The Standard for Embedded Core Test, 7 pages, Unversity of Jonkoping, School of Engineering, Sweden.

* cited by examiner

*Primary Examiner*—Sun James Lin
(74) *Attorney, Agent, or Firm*—Jackson & Co., LLP

(57) ABSTRACT

Method and system for providing a computer implemented process of performing design for testability analysis and synthesis in an integrated circuit design includes partitioning each logic block in an integrated circuit design based on one or more boundaries of multi-cycle initial setup sequence, excluding one or more partitioned logic blocks with multi-cycle initial setup sequence from valid candidate blocks, selecting a constraint setting set, extracting a subset of constraint settings from the selected constraint setting set, applying the extracted subset of constraint settings to the integrated circuit design, performing design for testability analysis and synthesis on the valid candidate blocks, performing scan cell replacement. The scan cell replacement may include performing class selection from a cell library and a gate-level netlist based on affinity between cells, determining a target characterization, such as timing, power, area, for example, for the scan cell replacement, and replacing one or more cells with a corresponding one or more scan cells having the closest target characteristics.

30 Claims, 13 Drawing Sheets

METHOD AND SYSTEM FOR PROVIDING FAST DESIGN FOR TESTABILITY PROTOTYPING IN INTEGRATED CIRCUIT DESIGNS

BACKGROUND OF THE INVENTION

1. Field of the Invention

The present invention relates to a method and system for providing fast Design for Testability (DFT) prototyping such as repetitive DFT implementation exploration before Automatic Test Pattern Generation (ATPG). More specifically, the present invention relates to a method and system for providing fast DFT prototyping to facilitate the application of DFT synthesis with traditional logic synthesis flow, including an STA (static timing analysis) enhanced DFT analysis approach with affinity-based scan replacement.

2. Description of the Related Art

As the complexity of today's chip design grows, the concept of Design for Testability (DFT) becomes more and more critical. Easy diagnosis of manufacturing defects of a complex System-on-chip (SoC) integrated circuit design relies on a good DFT methodology to be incorporated in the early chip design flow.

FIG. 1 is a block diagram representation of a typical IC design As shown, the SoC design 100 may include one or a plurality of third party Intellectual Property 101, 102, a clock generation block 103, analog blocks 104, memory blocks 105, core logic blocks 106, a plurality of I/O Pads 107. The Intellectual property 101, 102 may be, for example, a licensed proprietary design component. To incorporate DFT synthesis methodology in the design flow, test generation (including JTAG boundary scan blocks) and synthesizable core blocks may be used in the design flow. This is shown in FIG. 2. More specifically, FIG. 2 is a block diagram representation of a typical IC design with test generation and scan-style synthesizable core blocks. As can be seen from the Figure, the IC design representation shown in FIG. 2 includes a test generation block 201 as well as the other components of the IC design shown in FIG. 1.

As integrated circuits have become more complex and densely packed with gates, they have become progressively more difficult to test in order to ensure desired functionality. As a result, testability has become an increasingly more important and challenging goal of the integrated circuit design process. As discussed above, computer programs that aid in the design of testability circuitry for integrated circuits are often referred to as design for testability (DFT) processes. One approach to DFT, for example, is to take a netlist representing an integrated circuit design generated and to add and/or replace certain memory cells and associated circuitry of the netlist with special memory cells, called scan cells, designed to allow application of test vectors to certain portions of an integrated circuit produced according to the design.

Scan cells are interconnected to form scan chains. During test mode operation, scan test vectors in the form of a series of logical 1 and logical 0 test vector values are loaded into the scan cells of a scan chain. The circuit is caused to operate for a prescribed number of clock cycles using the test vectors as input. The results of the circuit operation can be captured in the form of logical 1 and logical 0 scan test results values. Scan test vectors and scan test results shall be referred to collectively as scan data. The same scan chain cells used to read in the test vectors can be used to capture the test results. The captured values are read out of the scan chain for observation and analysis. The results can be compared with expected results to determine whether the circuit operates as expected and to thereby determine whether defects are present.

FIGS. 3A–3B are flowcharts illustrating DFT prototyping and DFT synthesis, respectively, in a typical IC Design. Referring to FIG. 3A, typical DFT prototyping includes DFT synthesis step 310 whose results are verified to be satisfactory at step 320. In the case where the DFT synthesis provides satisfactory results at step 320, the routine proceeds to step 330 where Automatic Test Pattern Generation (ATPG) is applied. It should be noted that ATPG is a process to generate test patterns for a given netlist design to test the design's fault coverage. However, if the results at the DFT synthesis step 310 is determined to be not satisfactory at step 320, the routine performs the DFT synthesis step 310 again until the results are determined to be satisfactory at step 320.

More specifically, referring to FIG. 3B, the DFT synthesis step 310 typically includes the initial step of reading the design at step 311. Thereafter, the DFT constraints setting are determined at step 312. After determining the DFT constraints setting at step 312, DFT analysis is performed at step 313. Thereafter, at step 314, any DFT rule violation detected at DFT analysis step at 313 can be optionally fixed. Referring again to the Figure, at step 315, black box blocks like the memory blocks are bypassed, and thereafter, scan cell replacement is performed at step 316. As can be further seen from FIG. 3B, scan chain implementation and stitching is performed at step 317 after scan cell replacement at step 316, and thereafter, at step 318, final DFT reporting and netlist output is performed, before the routine proceeds to step 330 where ATPG is applied.

Referring back to FIG. 3B, more specifically, the DFT analysis step 313 includes various checking of DFT violations (such as for example, uncontrollable clock or asynchronous signals). Due to the nature of SoC system design, a traditional full chip DFT analysis requires a simulation-based analysis engine to account for the initial multi-cycle setup sequences of some building blocks, especially the test-generation blocks (e.g., block 201 in FIG. 2), and the clock generation blocks (e.g., block 103 in FIG. 2). Therefore, the process could be time consuming. There are also symbolic simulation approaches to speed up the simulation. However, symbolic-based approach typically cannot handle large SoC design due to common blowup in internal Binary Decision Diagram representation.

Referring back again to FIG. 3B, the scan cell replacement step 316 ensures that the replaced scan cells do not violate the original non-scan design's target requirements, such as power, timing and area requirements. This usually requires incremental optimization after scan cell replacement to ensure that the original specification is met. Incremental optimization, however, is another time consuming step. Furthermore, many DFT implementations are performed at the full-chip level, and often, IC designers are reluctant to run incremental optimization to avoid unexpected netlist change. Thus, the DFT synthesis tasks and ATPG in IC designs are often considered time consuming and difficult "back-end" design processes.

More specifically, scan cell replacement step 316 is an essential step in DFT synthesis 310 in IC design. The quality of scan cell replacement affects circuit area, timing and power consumption. In a typical scan implementation flow, an IC designer provides the tool an input netlist that is already logically and functionally optimized to satisfy a given set of constraints and timing signed off. The IC designer expects the non-scan sequential cells to be replaced as scan cells with minimum degradation to the circuit area, timing and power consumption. Any unnecessary optimization not only takes a long time, but also may change the circuit structure and characteristics including timing, circuit area, and power greatly.

U.S. Pat. No. 5,831,868 discloses scan cell replacement in which an ASCII function identification string based equivalence checking is used to decide which scan cell is used to replace the non-scan cell, emphasizing post scan chaining optimization to improve can implementation quality. U.S. Pat. No. 5,903,466 also discloses post scan chaining optimization step to improve scan implementation quality. However, post scan chaining optimization step may be too late in an IC design. Indeed, if the initial selection is bad, the optimization step can take a long time and completely disfigure a given circuit design such that no correlation exists between the original netlist and the final output netlist.

SUMMARY OF THE INVENTION

In view of the foregoing, in accordance with one embodiment of the present invention, there is provided a computer implemented process of performing design for testability analysis and synthesis in an integrated circuit design, comprising the steps of partitioning each logic block in an integrated circuit design based on one or more boundaries of multi-cycle initial setup sequence, excluding the one or more logic blocks with multi-cycle initial setup sequence from valid candidate blocks, selecting a constraint setting set, applying the set of constraint setting to the integrated circuit design, and performing design for testability analysis and synthesis on the valid candidate blocks.

The steps of selecting and applying the constraint setting set in one embodiment may include extracting a subset of constraint settings from the selected constraint setting set, and applying the extracted subset of constraint settings to the integrated circuit design.

The step of performing design for testability analysis and synthesis may include performing Static Timing Analysis (STA) based design for testability analysis and synthesis on the valid candidate blocks.

More over, the step of partitioning may include, for each logic block in the integrated circuit design, determining whether the logic block includes a multi-cycle initial setup sequence, including the logic block in the valid candidate blocks if the block does not include a multi-cycle initial setup sequence, and if the logic block includes the multi-cycle initial setup sequence, determining whether design partition is allowed between the logic block and other blocks in the integrated circuit design, and excluding the logic block in the valid candidate blocks if design partition is allowed, otherwise, if the design partition is not allowed, including the logic block from the valid candidate blocks.

Furthermore, when it is determined that the design partition is allowed, the process may include extracting and storing one or more internal or external fanin constraints and affected fanout object values. On the other hand, when it is determined that the design partition is not allowed, the process may include collecting the affected fanout object values when the logic block is in a stable test mode state after the multi-cycle initial setup sequence.

The step of selecting the constraint setting set may include selecting one of only external object constraint setting being allowed, only internal object constraint setting being allowed, and both internal and external object constraint settings being allowed.

Additionally, the applying step may further include the step of initiating the integrated circuit design to enter a stable test mode state with the multi-cycle setup. A computer implemented process for performing class and cell selection procedure in scan cell replacement for an integrated circuit design in accordance with another embodiment of the present invention includes encoding a cell to be replaced with a corresponding scan cell encoding the scan cell, determining a cost function between the encoded cell and the encoded scan cell, establishing an affinity between the cell and the corresponding scan cell based on the cost function.

The process of determining the cost function and establishing the affinity may include determining a Hamming distance between the encoded cell and the encoded scan cell, and establishing an affinity between the cell and the corresponding scan cell based on the determined Hamming distance.

Moreover, the scan cell may include a dual scan cell, and further, the cell may include a scan cell to which corresponds the dual scan cell.

In accordance with yet another embodiment of the present invention, there is provided a computer implemented process for performing scan cell replacement for an integrated circuit design comprising the steps of performing class selection from a cell library and gate-level netlist based on affinity between cells, determining a target characterization for the scan cell replacement, replacing one or more cells with a corresponding one or more scan cells having the closest target characteristics.

The target characteristics may include one or more of timing, area, power and/or other metrics.

More specifically, the target characteristics may include timing-based metrics, and further, where the step of determining the timing characterization may include selecting one of a static timing characterization and a dynamic timing characterization.

Additionally, when the static timing characterization is selected, the scan cell with timing characteristics that is closest to the corresponding cell may be selected based on library cell timing data.

Also, the dynamic timing characterization may include one or more of cell delay and context delay, the context delay including transition delay and connection delay.

Further, the library cell timing data may include one or more of a constraint type timing arc and a delay type timing arc, where in one aspect, the constraint type timing arc may correspond to timing constraints between pins, and further, where the delay type timing arc may correspond to timing delay between two pins.

In accordance with yet a further embodiment of the present invention, there is provided a computer implemented process of performing design for testability analysis and synthesis in an integrated circuit design, comprising the steps of partitioning each logic block in an integrated circuit design based on one or more boundaries of multi-cycle initial setup sequence, excluding the one or more logic blocks with multi-cycle initial setup sequence from valid candidate blocks, selecting a constraint setting set, applying the set of constraint setting to the integrated circuit design, performing design for testability analysis and synthesis on the valid candidate blocks, and performing affinity-based scan cell replacement.

In one aspect, the steps of selecting and applying the constraint setting may include extracting a subset of constraint settings from the selected constraint setting set, and applying the extracted subset of constraint settings to the integrated circuit design.

Moreover, the step of performing scan cell replacement may in a further embodiment include the steps of performing class selection from a cell library and gate-level netlist based on affinity between cells, determining a target characterization for the scan cell replacement, and replacing one or more cells with a corresponding one or more scan cells having the closest target characteristics.

The target characteristics may include one or more of timing, area, power and/or other metrics. Specifically, the target characteristics may include timing-based metrics.

In one aspect, the step of partitioning may include, for each logic block in the integrated circuit design, determining whether the logic block includes a multi-cycle initial setup sequence, including the logic block in the valid candidate blocks if the block does not include the multi-cycle initial setup sequence, and if the logic block includes the multi-cycle initial setup sequence, determining whether design partition is allowed between the logic block and other blocks in the integrated circuit design, and excluding the logic block in the valid candidate blocks if design partition is allowed, otherwise, if the design partition is not allowed, including the logic block from the valid candidate blocks.

The step of selecting the constraint setting set may include selecting one of only external object constraint setting being allowed, only internal object constraint setting being allowed, and both internal and external object constraint settings being allowed.

Also, the applying step may further include the step of initiating the integrated circuit design to enter a stable test mode state with the multi-cycle setup.

In accordance with yet still another embodiment of the present invention, there is provided a computer program product, comprising a medium readable by a computer, the computer readable medium having computer program code adapted to partition each logic block in an integrated circuit design based on one or more boundaries of multi-cycle initial setup sequence, exclude the one or more logic blocks with multi-cycle initial setup sequence from valid candidate blocks, select a constraint setting set, apply the set of constraint setting to the integrated circuit design, and perform design for testability analysis and synthesis on the valid candidate blocks.

In a further aspect, the steps of selecting and applying the constraint setting set may include extracting a subset of constraint settings from the selected constraint set, and applying the extracted subset of constraint settings to the integrated circuit design.

Furthermore, the computer program code may further be adapted to perform affinity-based scan cell replacement.

In the manner described above, in accordance with various embodiments of the present invention, to address the long runtime issues in the design processes during DFT rule checking for SoC designs, a DFT design partition methodology and synthesis user model is provided to apply a "static timing analysis" (STA) enhanced DFT analysis, which greatly reduces the run time for DFT analysis without losing the comprehensiveness of DFT rule checking.

Furthermore, to address the issues with runtime and undesired netlist change during incremental optimization after scan cell replacement, an affinity based scan replacement mechanism is provided in accordance with the various embodiments of the present invention to transform a non-scan design into a scan design for DFT with respect to the original user's target design constraints which usually includes power, timing and area specification.

Accordingly, by incorporating the STA enhanced DFT analysis (referred to as SEDAN herein) with the affinity based scan replacement in accordance with the various embodiments of the present invention, an improved design flow with DFT may be achieved in the early stage of the design process. More specifically, IC designers are able to explore many different DFT implementation styles, including number of scan chains, different test-mode clocking mechanism, ordering of scan chains, for example, which enables a fast DFT prototyping design flow. Indeed, the various embodiments of the present invention enables the DFT design flow to be no longer an undesirable time consuming back end process.

More specifically, in accordance with the various embodiments of the present invention, a quick, one-step scan cell replacement approach is provided that preserves as much as possible the circuit structure and other characteristics, while offering fine tuning possibility. Indeed, based on the concept of cell and class affinity, one embodiment of the present invention replaces the non-scan cell with the scan cell that has the closest characteristics to the non-scan cell, resulting in short runtime and good quality using multiplexer-based scan approach. In a further embodiment, the present invention may also be applied to Level Sensitive Scan Design (LSSD) methodology which uses, for example, master/slave latch pairs to emulate the multiplexing behavior of MUX-based scan methodology.

Indeed, because the approach in accordance with the various embodiments of the present invention establishes the mapping between non-scan cells and scan cells, it can be applied to the un-scan process, where scan cells are replaced with corresponding non-scan cells, for example, because of DFT violations. While some of the embodiments of the present invention focuses on the netlist input flow, the flow process may be applied to the RTL input as well. More specifically, this can be achieved by invoking logical synthesis tool to generate a netlist satisfying given constraints and then applying the processes disclosed in the various embodiments of the present invention, which results in a scan replaced netlist with satisfactory timing and power characteristics and little area overhead in a very short runtime. In other words, for RTL input, sequential mapping to non-scan netlist may be performed; and then the affinity based scan cell replacement may be applied to change to a netlist with scan cells.

These and other features and advantages of the present invention will be understood upon the following detailed description of the invention and the accompanying drawings.

INCORPORATION BY REFERENCE

The present application is related to application Ser. No. 10/434,964 filed May 9, 2003 titled "Timing Based Scan Chain Implementation In An IC Design", and to application Ser. No. 10/435,329 filed May 9, 2003, titled "Scan Insertion With Bypass Logic In An IC Design", each assigned to assignee of the present application, and the disclosures of each of which are incorporated herein by reference for all purposes.

DETAILED DESCRIPTION OF THE INVENTION

Figure 4:
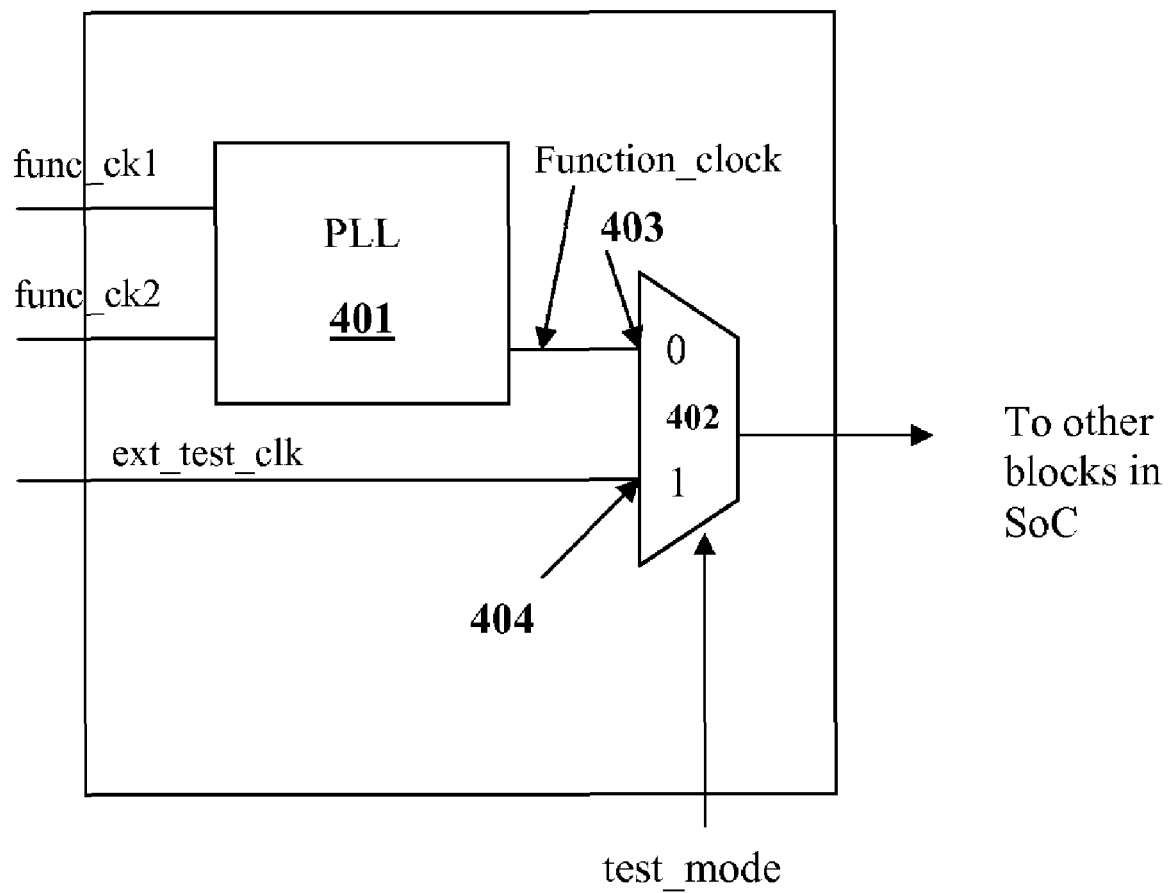
FIG. 4 is an illustration of a clock generation block of an IC design.

FIG. 4 is an illustration of an example of a clock generation block of an IC design. Referring to the Figure, as shown, clock generation block 400 includes a phase-locked loop (PLL) unit 401 and a multiplexer 402. As can be seen from the Figure, the input to the PLL unit 401 includes two functional clock signals func_ck1 and func_ck2, generating an output signal function_clock representing a functional clock signal. The functional clock signal output from the PLL unit 401 is input to the inverting input terminal 403 of the multiplexer 402, while an external test clock signal ext_test_clk is input to the noninverting input terminal 404 of the multiplexer 402. In this manner, the clock signal for the core logic of the IC design comes from the multiplexer 402 selected by the test mode signal test_mode, where the test mode signal test_mode is generated by the test generation block described in further detail below in conjunction with FIG. 5.

Referring back to FIG. 4, there are two major types of clocks for a typical integrated circuit design—a functional clock and a test clock. A design operating in the function mode uses the functional clock, while the test clock is used if the design is operating in a test mode. For example, a typical test clock frequency is 10 MHz, but may vary due to different external tester used to test the SoC design. A functional clock, by comparison, is usually much faster than the test clock.

Figure 5:
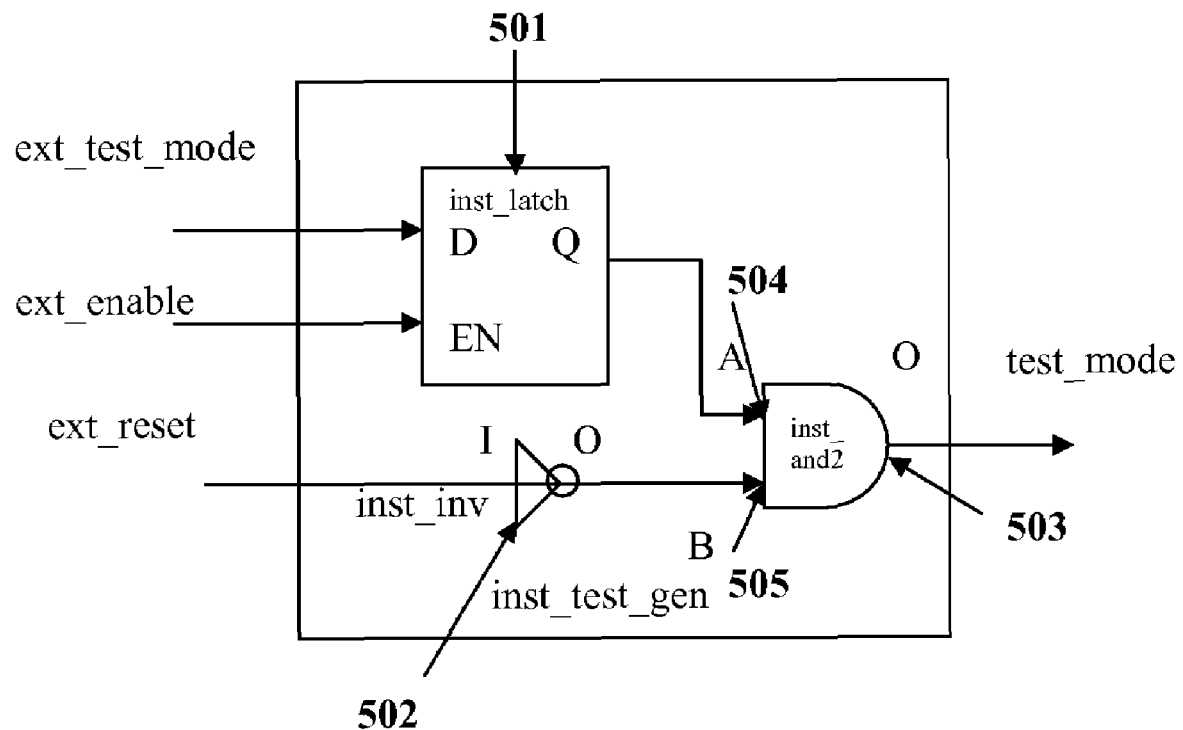
FIG. 5 is an illustration of a test-generation block with customized sequential logic of an IC design.

FIG. 5 is an illustration of an example of a test-generation block with customized sequential logic of an IC design. Referring to FIG. 5, the test generation block 500 includes a latch 501, an inverter 502, and an AND gate 503, the input terminals 504, 505 of the AND gate respectively receiving the output signal of the latch 501 and the inverter 502, and further, where the AND gate 503 is configured to output the test mode signal test_mode.

In other words, the test generation block 500 includes sequential logic to generate a stable test mode signal to be used in clock generation block 400 (FIG. 4) and by other blocks in the SoC design. Referring back to FIG. 5, the test generation block 500 is shown with customized sequential logic.

Figure 6:
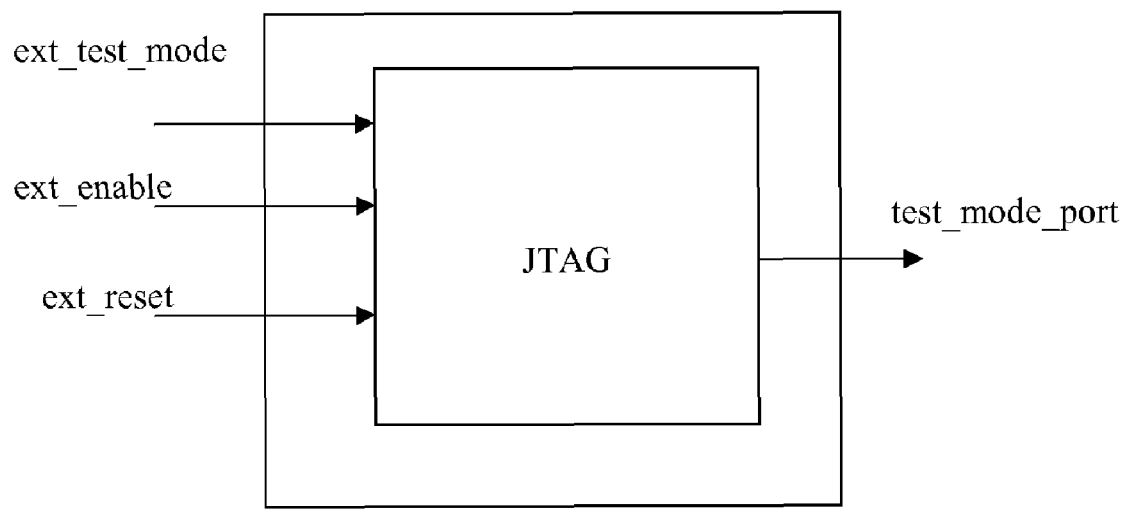
FIG. 6 is an illustration of a test generation block with JTAG boundary scan sequential logic of an IC design.

FIG. 6 is an illustration of a test generation block with JTAG boundary scan sequential logic of an IC design. Referring to FIG. 6, the test generation block 600 is shown with three input signals—external test mode signal (ext_test_mode), external enable mode signal (ext_enable), and external reset signal (ext_reset), and outputting test mode signal test_mode. Compared with FIG. 5, the three input signals are the same external signals from I/O Pads as in FIG. 5, but in FIG. 6, these three signals are inputs to a more complex test-generation function than those in FIG. 5. The test mode signal (test_mode) becomes stable after a few initial setup cycles such that the SoC design may be directed to enter either the test mode or the function mode depending on the designer's requirement.

Figure 1:
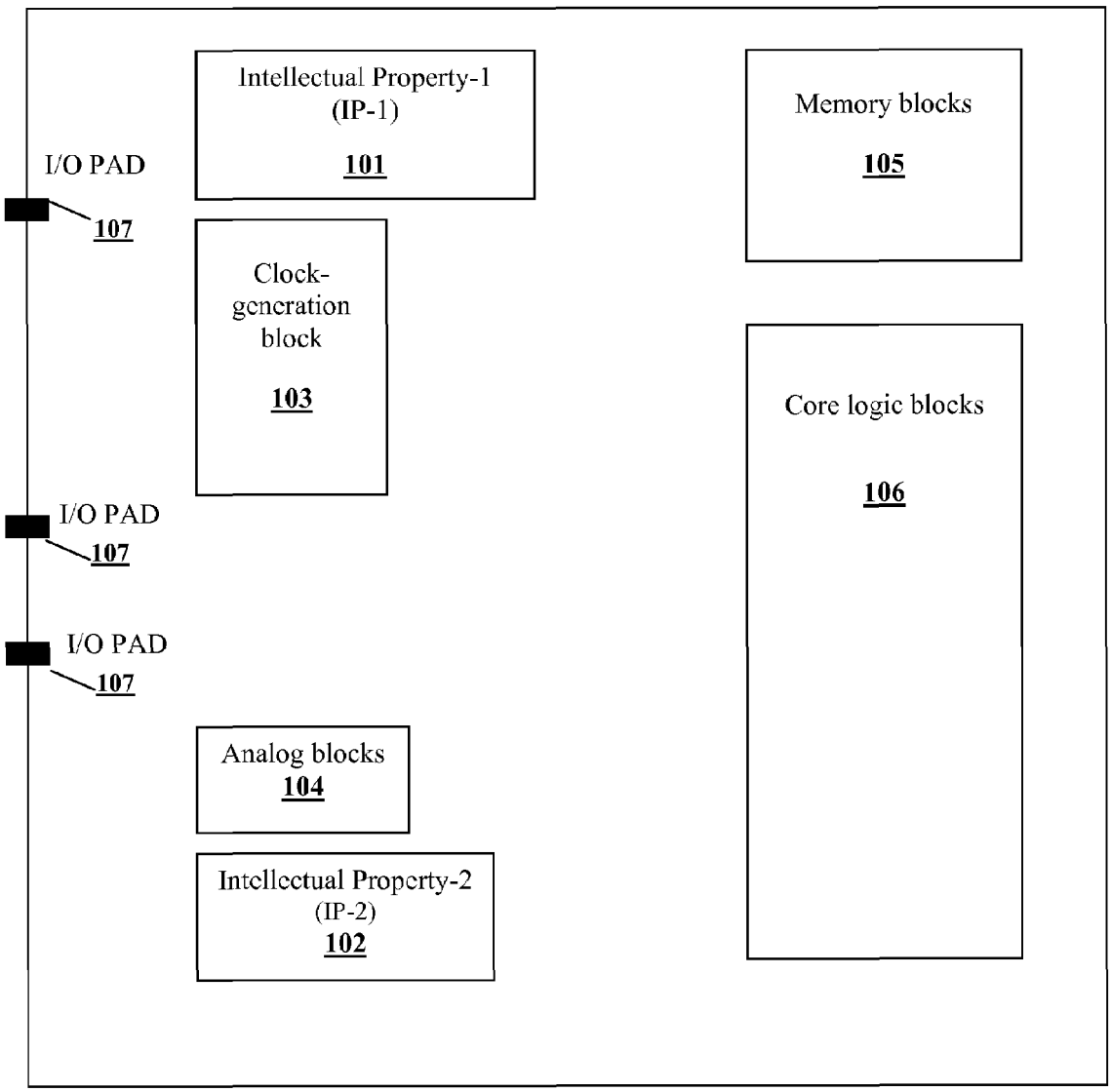
FIG. 1 is a block diagram representation of a typical IC design.
Figure 2:
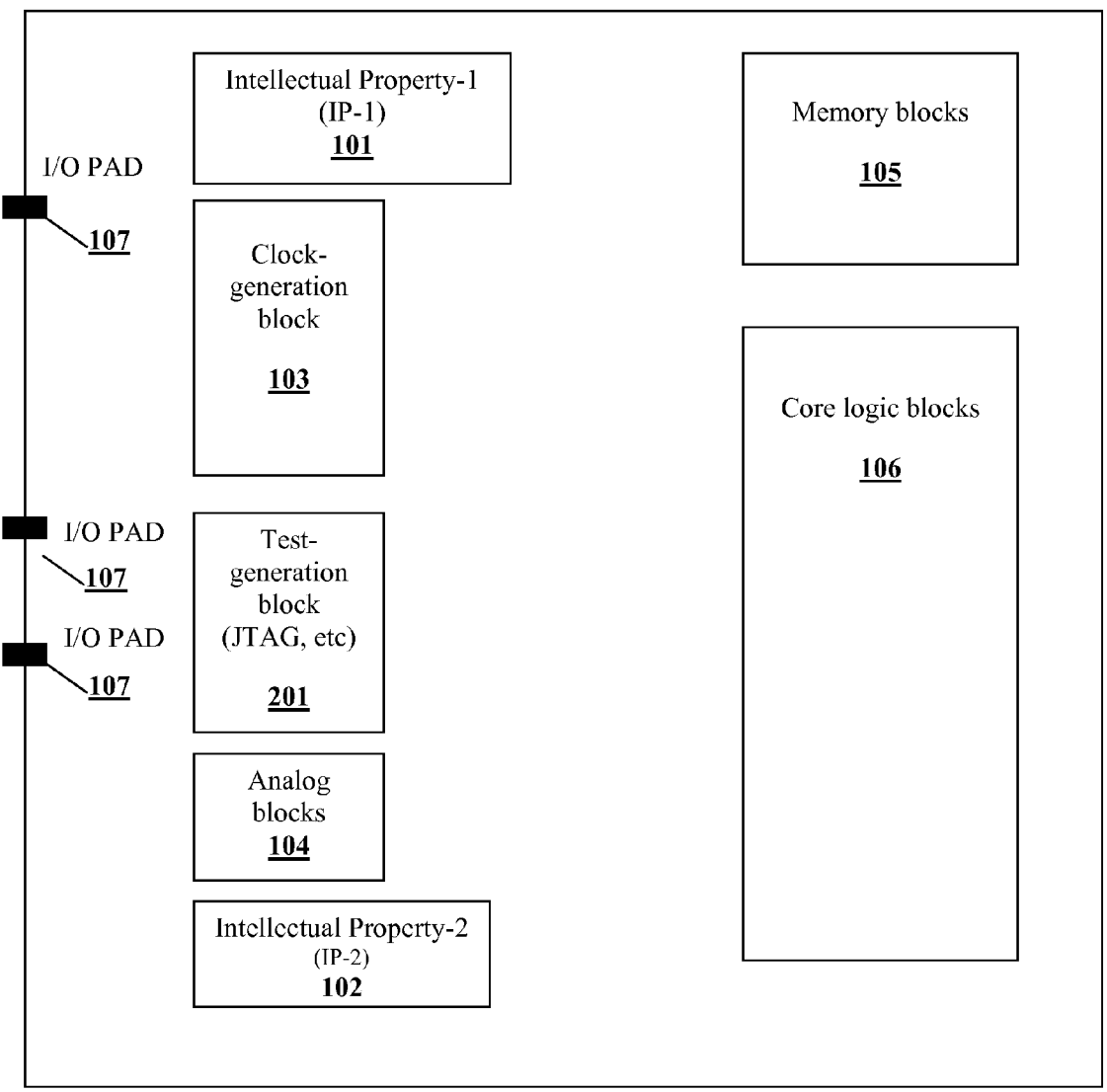
FIG. 2 is a block diagram representation of a typical IC design with test generation and synthesizable core blocks.
Figures 3A, 3B:
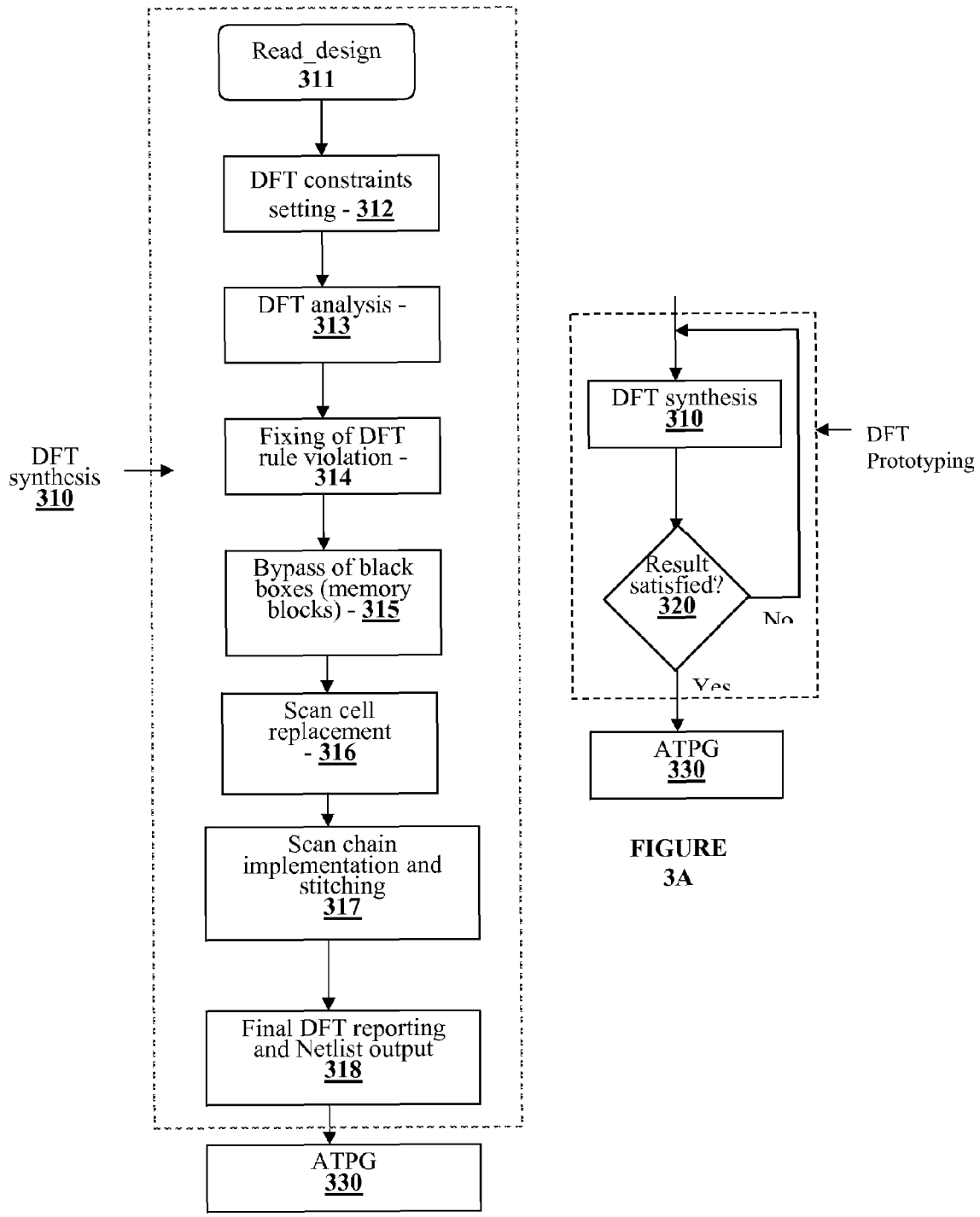
FIGS. 3A–3B are flowcharts illustrating DFT prototyping and DFT synthesis, respectively, in a typical IC Design.

Referring back to FIG. 1, the core logic block 106 typically consists of synchronous sub-blocks and asynchronous sub-blocks. The majority of the core logic blocks 106 include synchronous sub-blocks in integrated circuit designs, thus, in one approach, we assume that the core logic is fully synchronous and the asynchronous parts belong to a different block than the core logic block 106. For a core logic with both synchronous and asynchronous or multi-cycle blocks, partitioning methods and constraint setting methods described herein may be applied to most logic blocks.

Static timing analysis (STA) analyzes a design with respect to a static (one-cycle) snapshot of the circuit behavior. This is in contrast to a dynamic timing analysis that is similar to an event-driven simulation based on cumulative multi-cycle events. STA approach has been used for the multi-million gate SoC designs due to its significant speed and capacity advantage over traditional dynamic timing analysis. Indeed, STA approach is well suited for full synchronous design for the complex integrated circuit designs.

Constrained analysis may be performed in STA. More specifically, specific values may first be assigned to certain objects including design ports and instance pins. Then, constant value propagation and logic simplification are performed, and all timing characteristics of the SoC design are collected. As used herein, "set_dft_apply" is used to denote the assignment of constant STA object constraints in the context of DFT synthesis. For example, the following command implies the pin value of inst_test_gen/inst_and2/0 is a constant "1" during the DFT analysis:

set_dft_apply 1 inst_test_gen/inst_and 2/0

Traditional DFT analysis does not take advantage of the STA techniques due to its inability to support the multi-cycle initial setup sequence in the test generation logic or the clock generation logic. Many STA checking is directly related to DFT analysis and ATPG, such as, for example, gated clock checking and unclocked checking. Many other DFT analysis can be implemented with constrained STA analysis. For example, active asynchronous signals DFT violations (preventing scan data from being shifted properly when the design is in test mode) may be achieved by checking STA's value propagation result of all the asynchronous pins with the constraints of test mode settings. The bottleneck of traditional DFT analysis occurs primarily due to the use of simulation based approach to address a few blocks with multi-cycle behavior, which results in overall system slow-down. Accordingly, the design approaches discussed below are implemented with the STA techniques for DFT analysis in accordance with various embodiments of the present invention of design partitioning to enable fast DFT prototyping.

Figure 7:
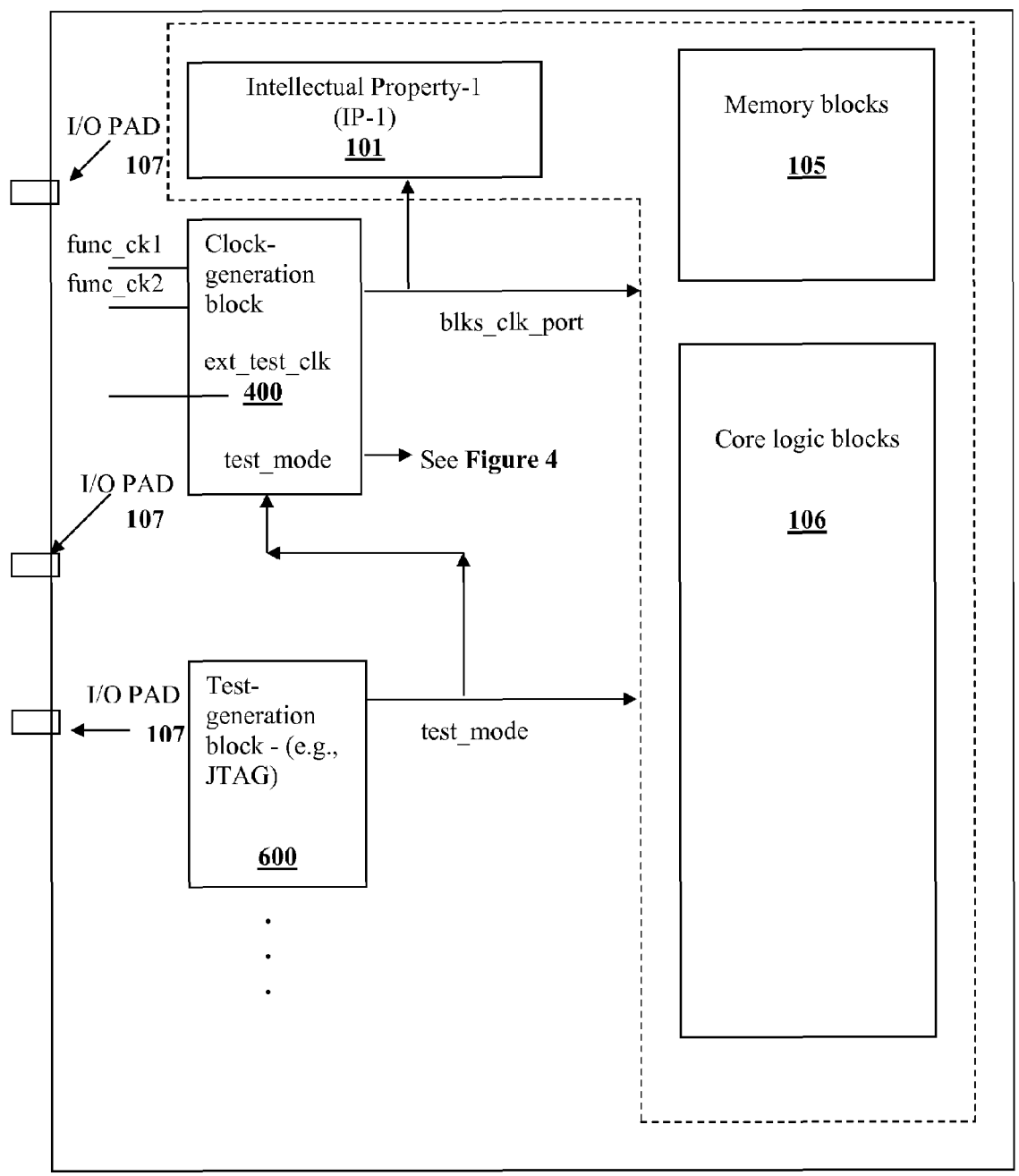
FIG. 7 is a block diagram representation of IC design partitioning based on boundaries of multi-cycle blocks for DFT analysis in accordance with one embodiment of the present invention.

FIG. 7 is a block diagram representation of an IC design partitioning based on boundaries of multi-cycle blocks for DFT analysis in accordance with one embodiment of the present invention. Referring to the Figure, the SoC design is partitioned according to the boundaries of multi-cycle blocks. The multi-cycle blocks (the non-shaded area) are then excluded temporarily from the DFT analysis. More specifically, the DFT analysis in accordance with one embodiment of the present invention is performed for the synchronous blocks along with the STA-style constraint setting shown below:

```
set_dft_apply 1 test_mode_port
⋮
create_dft_clock blks_clk_port
⋮
```

In accordance with one embodiment of the present invention, the DFT analysis may be performed after the constant value propagation of test_mode_port to trim down the design space required for DFT analysis. Due to fast STA engine used for DFT analysis, synchronous core logic may be analyzed much faster. After the core logic is analyzed, other building blocks of the SoC design may be integrated with the traditional simulation-based DFT analysis approach.

Figure 8:
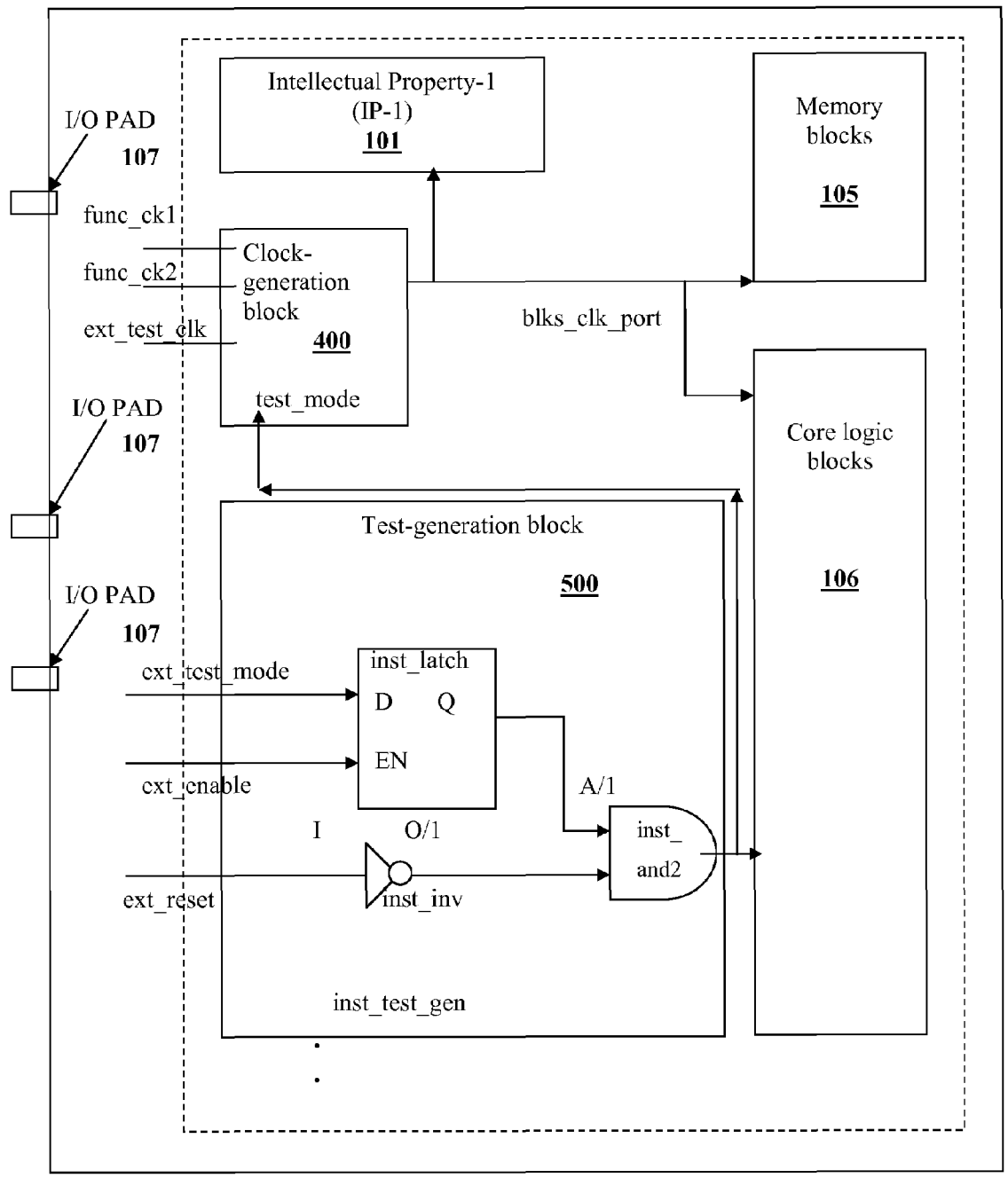
FIG. 8 is a block diagram representation of the DFT analysis of the IC design with STA (static timing analysis)-style constraint setting on internal design objects in accordance with one embodiment of the present invention.

FIG. 8 is a block diagram representation of the DFT analysis of the IC design with STA-style constraint setting on internal design objects in accordance with one embodiment of the present invention. Referring to the Figure, the STA-style constraints are set to internal design objects to enable DFT analysis on the entire SoC design. Because STA cannot simulate multi-cycle behavior, a mechanism to set internal object values is used to capture the state of the SoC design after the initial setup sequence. As can be seen from FIG. 8, the DFT analysis may be performed in accordance with one embodiment of the present invention for the entire SoC design along with the STA-style constraint settings set forth below:

```
⋮
set_dft_apply 1 inst_test_gen/inst_and2/A
set_dft_apply 1 inst_test_gen/inst/inv/O
⋮
creat_dft_clock ext_test_clk
⋮
```

Referring back to FIG. 8, the STA-enhanced DFT analysis in accordance with one embodiment of the present invention may be achieved by the constraint value propagation through the inst_test_gen/inst_and2/O enabling the SoC design to enter a stable test_mode state.

Figure 9:
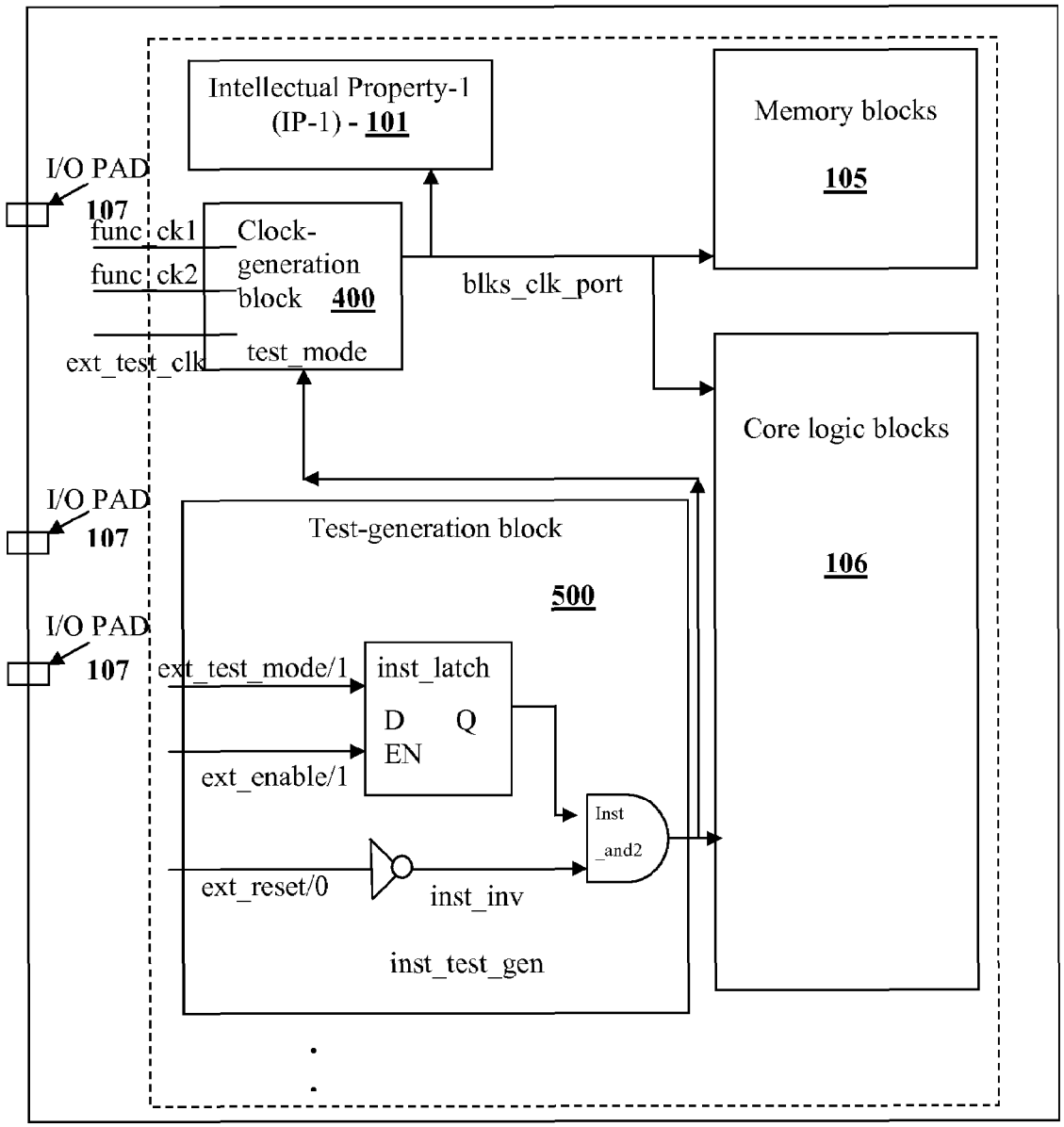
FIG. 9 is a block diagram representation of the DFT analysis on the IC design with STA-style constraint setting on external design objects in accordance with one embodiment of the present invention.

FIG. 9 is a block diagram representation of the DFT analysis on the IC design with STA-style constraint setting on external design objects in accordance with one embodiment of the present invention. The approach shown in FIG. 9 is similar to that shown in FIG. 8, but the constraints are set at external objects (or PAD objects) of the SoC design. Therefore, more complex STA setting is needed to propagate the information through PADs to internal design objects to capture the snapshot behavior after the initial setup sequence. The STA setting for the embodiment shown in FIG. 9 in accordance with the present invention is as follows:

```
create_dft_clock ext_test_clk
⋮
set_dft_apply 0 ext_reset
set_dft_apply 1 ext_enable
set_dft_apply 1 et_test_mode
⋮
set sta_case_analysis_thru_latch_cell always
```

As shown above, the STA setting enables the input values of the inst_test_gen/inst_latch to be propagated directly to inst_test_gen/inst_and2/A and then enable the SoC design to enter a stable test_mode to further apply STA-enhanced DFT analysis.

Indeed, in accordance with the various embodiments of the present invention related to design partitioning, even though STA analysis can not simulate multi-cycle initial set up sequence, several STA approaches are disclosed to initialize the SoC design into a stable test_mode state with respect to the test_generation block, and further apply fast STA-enhanced DFT analysis for the entire SoC design. Furthermore, within the scope of the present invention, similar approaches may be used to other design blocks that requires multi cycle initial setup sequences (for example, such as the clock generation or analog block).

Figure 10A:
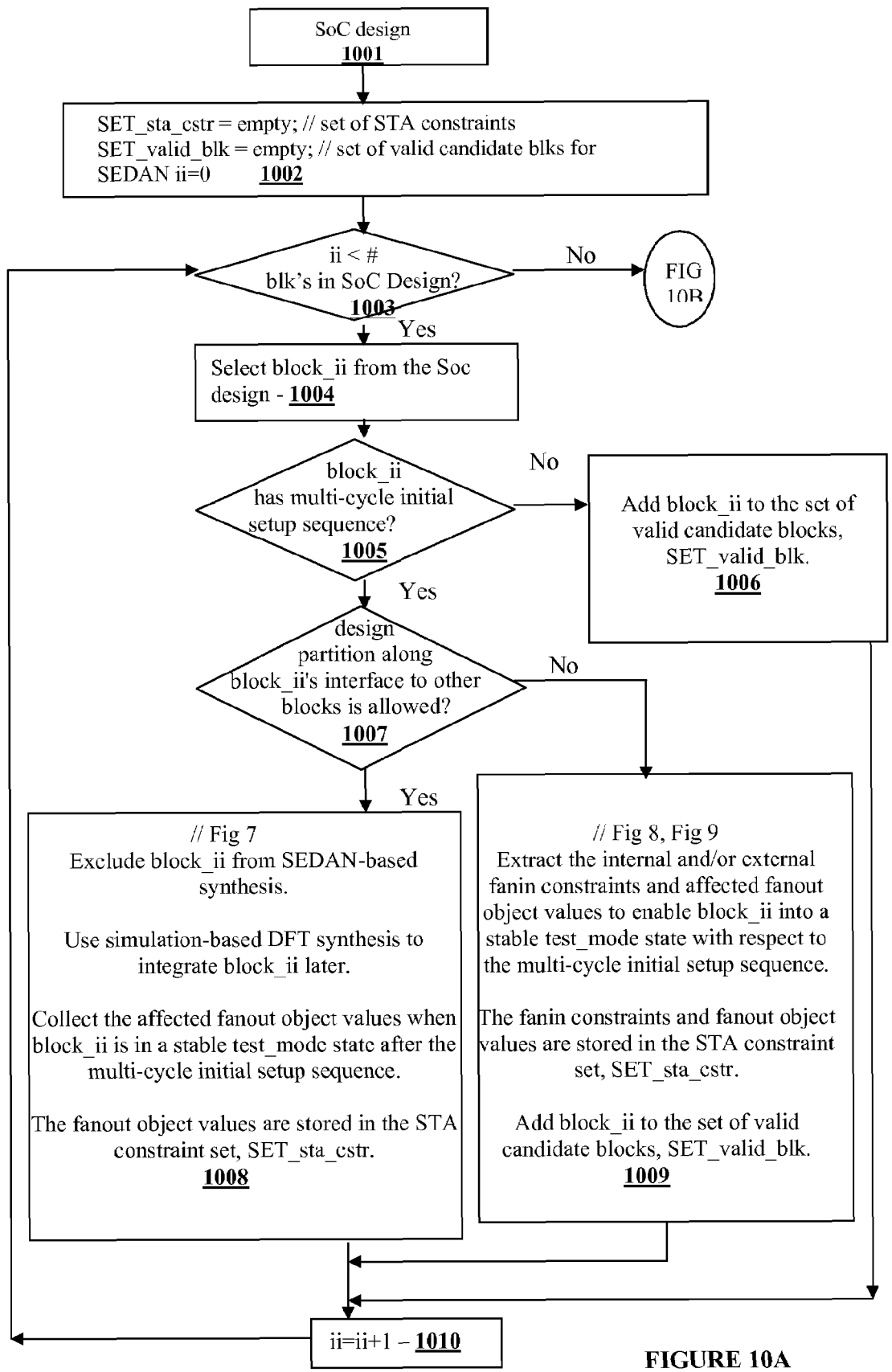
FIGS. 10A–10B are flowcharts illustrating the STA enhanced DFT partitioning and synthesis in accordance with one embodiment of the present invention.
Figure 10B:
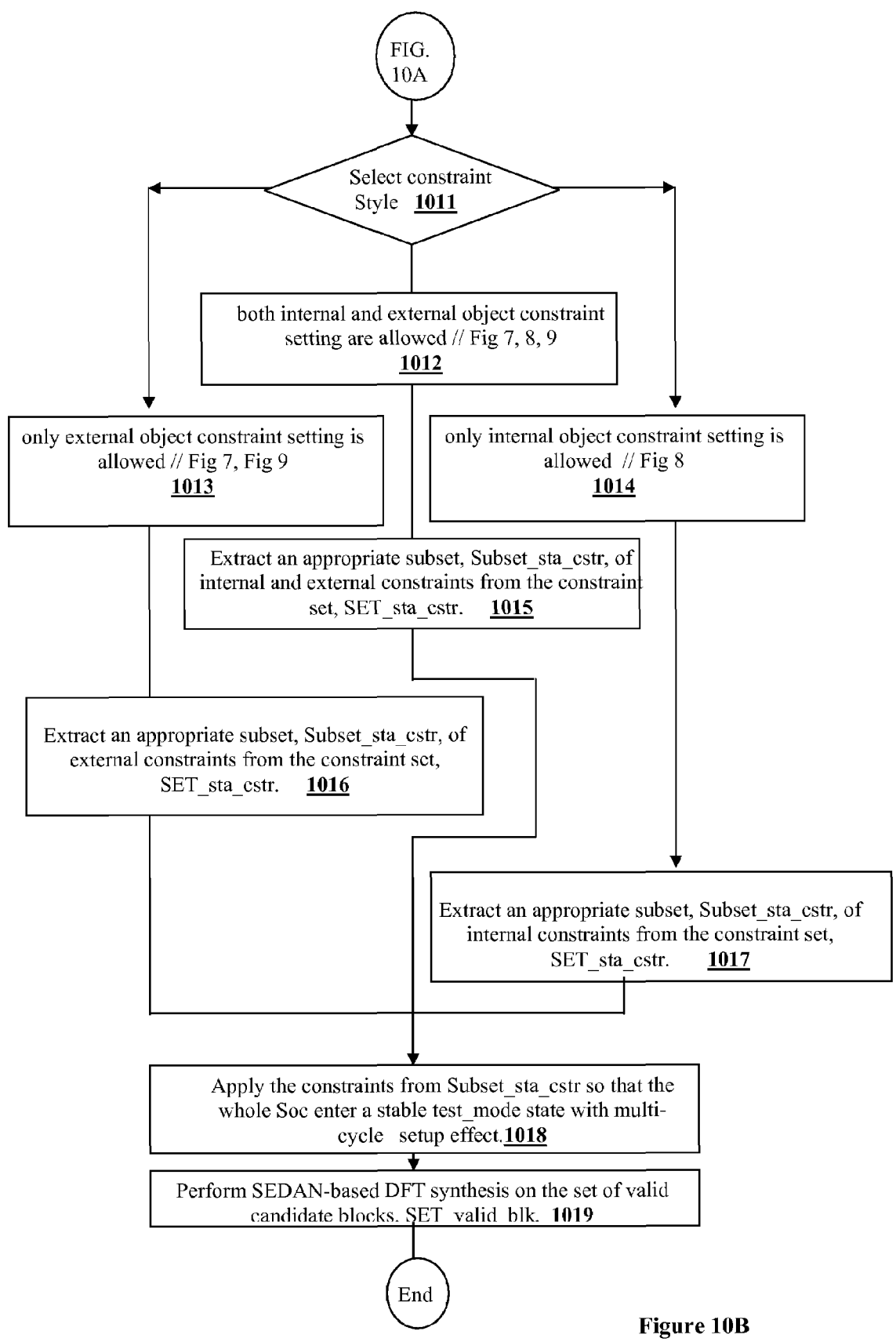

FIG. 10 is a flowchart illustrating the STA (static timing analysis) enhanced DFT partitioning and synthesis in accordance with one embodiment of the present invention. Referring to FIG. 10, for a given SoC design at step 1001, an STA constraint setting set (SET_sta_cstr), and a valid candidate block set (SET_valid_blk) are initialized to empty sets at step 1002. Thereafter for each logic block (block_ii) of the SoC design at step 1004 goes through a number of processes (steps 1005 to 1009) depending upon each block's inherent property as described in further detail below. Referring to the Figure, if at step 1003 it is determined that all of the logic blocks for the particular SoC design has gone through the one or more processes (steps 1005 to 1009) as pertinent to the inherent property of the particular logic block, then the routine proceeds to FIG. 10B described in further detail below.

Referring back to FIG. 10A, at step 1004, for each of the given logic block of the particular SoC design of interest selected at step 1004, it is determined whether the selected block (block_ii) has multi-cycle initial setup sequence. If it is determined at step 1005 that the selected block (block_ii) does not have multi-cycle initial setup sequence, then at step 1006, the selected block (block_ii) is added to the set of valid candidate blocks, (SET_valid_blk), and the procedure returns to step 1003 for the next block in the SoC design. If, on the other hand, at step 1005 it is determined that the selected block (block_ii) has multi-cycle initial setup sequence, then at step 1007, it is determined whether design partition along the selected block's (block_ii) interface to other blocks in the SoC design is allowed.

Referring again to the Figure, if at step 1007 it is determined that design partition along the selected block's interface to other blocks is allowed, then at step 1008, then the routine in one embodiment is configured to perform the IC design partitioning based on boundaries of multi-cycle blocks for DFT analysis as described above, for example, in conjunction with FIG. 7. By way of an example, at step 1008, the selected block (block_ii) is excluded from the static timing analysis (STA) enhanced DFT analysis based synthesis (SEDAN-based synthesis), and traditional simulation based DFT synthesis is applied to the selected block to integrate the selected block (block_ii). More specifically, the affected fanout object values are collected when the selected block (block_ii) is in a stable test mode state after the multi-cycle initial setup sequence. And, the fanout object values are stored in the STA constraint setting set (SET_sta_cstr).

Referring back to FIG. 10A, if at step 1007 it is determined that the design partition along the selected block's (block_ii) interface to other blocks not allowed, then at step 1009, the internal and/or external fanin constraints and the affected fanout object values are extracted to enable the selected block (block_ii) into a stable test mode state with respect to the multi-cycle initial setup sequence. By way of an example, the DFT analysis of the IC design with STA-style constraint setting on internal design objects and on external design objects as described above in conjunction with FIGS. 8 and 9, respectively, are implemented.

In other words, in one embodiment, the fanin constraints and fanout object values are then stored in the STA constraint setting set (SET_sta_cstr), and the selected block (block_ii) is added to the set of valid candidate blocks (SET_valid_blk). Thereafter, the routine returns to step 1003 to perform the processes described above for the next selected block (block_ii) in the SoC design as determined at step 1010.

Referring now to FIG. 10B, as discussed above, if at step 1003 of FIG. 10A it is determined that all of the blocks for the particular SoC design has been processed as pertinent to the inherent property of the particular logic block, then the routine proceeds to FIG. 10B, where at step 1011, the constraint setting set (SET_sta_cstr) is consolidated to an appropriate subset (Subset_sta_cstr) depending upon one of a plurality of constraint styles selected at step 1011. More particularly, the designer may select among a first constraint style where only the external object constraint settings are allowed (step 1013) such as described above in conjunction with FIGS. 7 and 9, a second constraint style wherein only the internal object constraint setting is allowed (step 1014) such as described above in conjunction with FIG. 8, and a third constraint style where both the internal and the external object constraint settings are allowed (step 1012) such as described above in conjunction with FIGS, 7, 8, and 9.

Referring to the Figure, if at step 1011, the first constraint style setting only the external object constraint setting (step 1013) is selected, then at step 1016 the appropriate subset (Subset_sta_cstr) of the external constraints are extracted from the constraint setting set (SET_sta_cstr). If at step 1011, the second constraint style setting only the internal object constraint setting (step 1014) is selected, then at step 1017, the appropriate subset (Subset_sta_cstr) of the internal constraints are extracted from the constraint setting set (SET_sta_cstr). Lastly, if at step 1011, the third constraint style setting both the internal and external object constraint settings (step 1012) is selected, then at step 1015, the appropriate subset (Subset_sta_cstr) of the internal and external constraints are extracted from the constraint setting set (SET_sta_cstr).

After the appropriate subset (Subset_sta_cstr) of the constraint setting set (SET_sta_cstr) is generated as discussed above, at step 1018, the constraints from the selected subset (Subset_sta_cstr) is applied so that the entire SoC enter a stable test_mode state with multi-cycle setup effect. Thereafter at step 1019, the STA enhanced DFT analysis based DFT synthesis is applied to the set of valid candidate blocks (SET_valid_blk).

In the manner described above, in accordance with various embodiments of the present invention, to address the long runtime issues in the design processes during DFT rule checking for SoC designs, a DFT synthesis user model is provided to apply a "static timing analysis" (STA) enhanced DFT analysis, which greatly reduces the run time for DFT analysis without losing the comprehensiveness of DFT rule checking.

Figure 11:
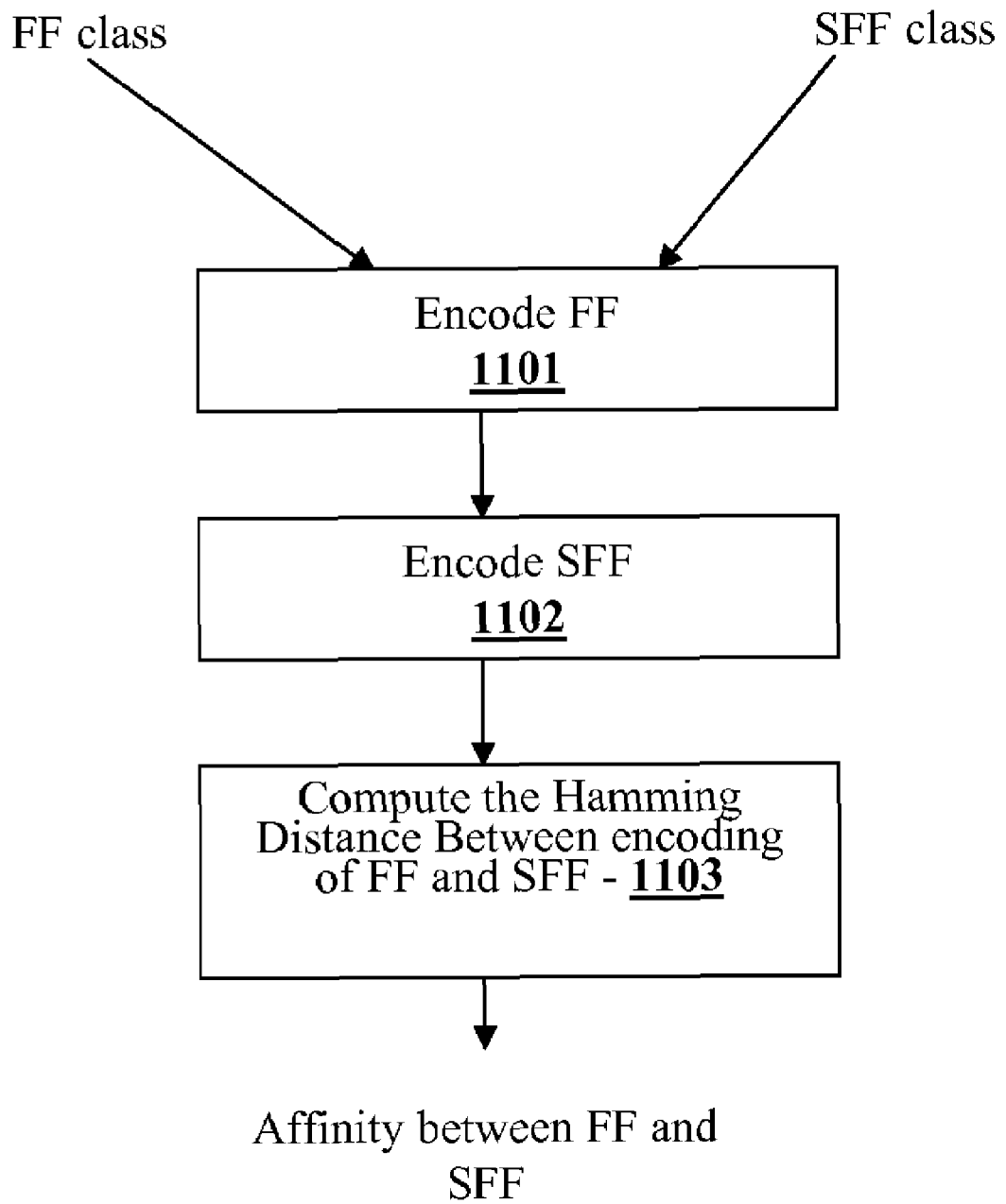
FIG. 11 is a flowchart illustrating hamming distance based calculation for affinity based scan cell replacement in DFT synthesis for IC design in accordance with one embodiment of the present invention.

FIG. 11 is a flowchart illustrating hamming distance based calculation for affinity based scan cell replacement in DFT synthesis for IC design in accordance with one embodiment of the present invention. A cell library includes multiple classes. Each class may have one or more cells. The cells under the same class have identical functionalities and pins. The library describes the functionality, area, timing and power characteristics, and the like. The term "FF" is used to indicate the cell that is going to be replaced with its corresponding scan cell, while the term "SFF" is used to indicate the corresponding scan cell. It should be noted that in one embodiment, an FF cell can be a scan cell itself and the corresponding SFF may be referred to as a dual-scan cell.

Referring back to FIG. 11, the library compilation process extracts cell classes and establishes the mapping between FF classes and SFF classes as part of the input shown in FIG. 11. At step 1101 the FF cell is encoded based on the FF class determined, and at step 1102, the SFF scan cell is enclosed based on the SFF class determined. It should be noted that within the scope of the present invention, the two steps 1101 and 1102 are interchangeable such that step 1102 may be performed before step 1101, and further, steps 1101 and steps 1102 may also be performed simultaneously.

As shown in the Figure, the process in accordance with one embodiment includes the step of choosing the corresponding SFF class based on affinity, and once the corresponding SFF class is determined, performing affinity-based cell selection and replacement discussed in further detail below.

Before performing affinity determination, cell pin attributes which described the logic of each cell pin are determined. Some pin attributes are specified in the library by the library designer, while others are implied in the functionality of the pins or the cells. By way of an example, the following pins and corresponding attributes may be found in an SFF class:

| | |
|---|---|
| DI: | data in |
| DO: | data out |
| DOI: | data out inverted |
| CK: | clock |
| AS: | asynchronous set |
| AR: | asynchronous reset |
| SS: | synchronous set |
| SR: | synchronous reset |
| LD: | load |

-continued

| | |
|---|---|
| SI: | scan in |
| SO: | scan out |
| SOI: | scan out inverted |
| SE: | scan enable (inverted) |

The SI, SO, SOI and SE pins are specific to the SFF cell, while the other pins may appear in the FF cell. More pins and attributes can be added for specific library. For example, SE1 for the inner scan enable pin of a dual-scan cell, or LD can be further divided into asynchronous load and synchronous load. Alternatively, the clock may be further divided into positive-edge triggered or negative-edge triggered.

Figure 12:
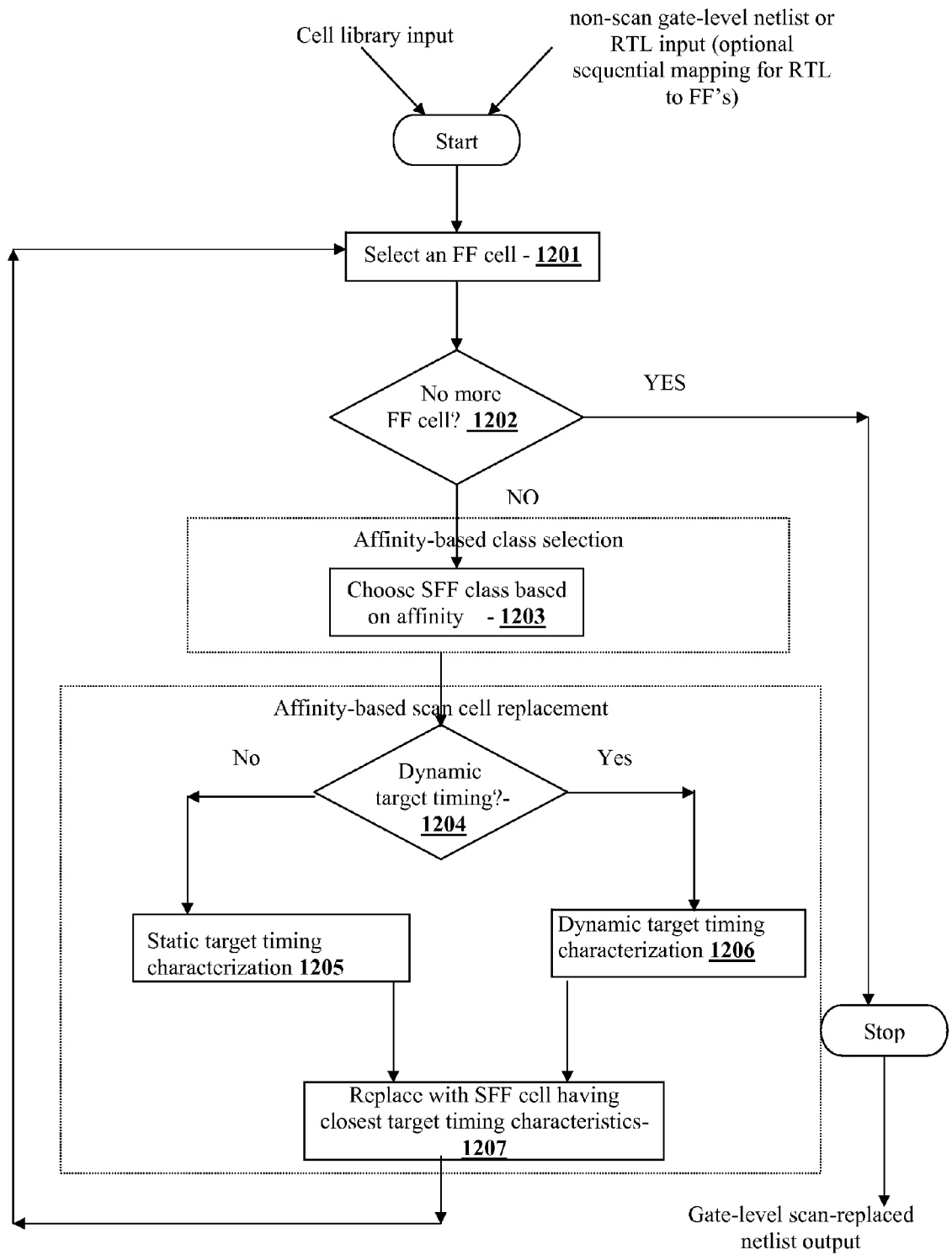
FIG. 12 is a flowchart illustrating an affinity based scan cell replacement in DFT synthesis in IC design in accordance with one embodiment of the present invention.

FIG. 12 is a flowchart illustrating an affinity based scan cell replacement in DFT synthesis in IC design in accordance with one embodiment of the present invention. The target design constraint may be timing, area, or power, etc. For simplicity, we use timing as an example target constraint, but the discussion hereinbelow is similarly applicable where the target design constraint is timing, area or power, etc. More specifically, the procedure shown in FIG. 12 may be used to measure the affinity of an FF class and an SFF class based on Hamming distance. Referring to the Figure, at step 1201, with the cell library input and the non-scan gate-level netlist or RTL input, an FF cell is selected. It should be noted that for RTL input, the sequential mapping is performed to produce the FF's. Thereafter, it is determined whether there are no additional FF cells at step 1201. If it is determined at step 1202 that there are no additional FF cells, then the procedure is terminated and the gate level scan-replaced netlist is output. On the other hand, if at step 1202 it is determined that there are additional FF cell, then at step 1203, affinity-based class selection is performed by choosing the SFF class based on affinity as discussed in conjunction with FIG. 11 discussed above—that is, by calculating the Hamming distance between their encoding.

Referring to the Figure, after the SFF class is selected at step 1203, affinity-based scan cell replacement is performed by first determining choosing between static timing characterization and dynamic timing characterization at steps 1204–1206. Thereafter at step 1207, scan cell replacement is performed with SFF cell having the closest timing characteristics. Thereafter, the routine returns to step 1201 where the next FF cell is selected and the steps 1202 through 1207 are performed until at step 1202 where it is determined that there are no additional FF cells.

The SFF class that has the minimum distance from the given FF class is called the FF class's native scan class. By way of an example, assume the following FF class QDFF:

Clock pin: CK
Data in pin: D
Data out pin: Q

Further, two candidate SFF classes QDFZN and QDFZCRN are provided with the following information:

QDFZN:
Clock pin: CK
Data in pin: D
Data out pin/scan out pin: Q
Scan in pin: TI
Scan enable pin: TE QDFZCRN:
Clock pin: CK
Data in pin: D
Data out pin/scan out pin: Q
Scan in pin: TI
Scan enable pin: TE
Synchronous reset pin: SR Both SFF classes are valid candidates, given the following input netlist:

QDFF (.CK(clock), .D(data_in), .Q(data_out));

In this case, either

QDFZN (.CK(clock), .D(data_in), .Q(data_out), .TI(test_in), .TE(test_enable));

or

QDFZCRN (.CK(clock), .D(data_in), .Q(data_out), .TI(test_in), .TE(test_enable), .SR(1'b0));

results, and assuming SR is active high, first, encoding of QDFF is performed:

| AXIS | DI | DO | DOI | CK | AS | AR | SS | SR | LD | SI | SO | SOI | SE |
|---|---|---|---|---|---|---|---|---|---|---|---|---|---|
| PIN | D | Q | | CK | | | | | | | | | |
| CODE | 1 | 1 | 0 | 0 | 0 | 0 | 0 | 0 | 0 | 0 | 0 | 0 | 0 | where AXIS indicates the attributes to be encoded against, PIN is the actual pins the encoded cell has, and CODE is the encoding result of the cell. Thereafter, the encoding of QDFZN is performed:

| AXIS | DI | DO | DOI | CK | AS | AR | SS | SR | LD | SI | SO | SOI | SE |
|---|---|---|---|---|---|---|---|---|---|---|---|---|---|
| PIN | D | Q | | CK | | | | | | TI | | | TE |
| CODE | 1 | 1 | 0 | 0 | 0 | 0 | 0 | 0 | 0 | 1 | 0 | 0 | 1 |

Then encoding of QDFZCRN is performed:

| AXIS | DI | DO | DOI | CK | AS | AR | SS | SR | LD | SI | SO | SOI | SE |
|------|----|----|-----|----|----|----|----|----|----|----|----|-----|----|
| PIN  | D  | Q  |     | CK |    |    |    | SR |    | TI |    |     | TE |
| CODE | 1  | 1  | 0   | 0  | 0  | 0  | 0  | 1  | 0  | 1  | 0  | 0   | 1  |

The affinity of QDFF and QDFZN can be decided by computing the Hamming Distance between their encoding as follows:

Affinity(QDFF, QDFZN)=HD(1100000000000, 1100000001001)=2

The affinity of QDFF and QDFZCRN may be decided by computing the Hamming Distance between their encoding as follows:

Affinity(QDFF, QDFZCRN)=HD(1100000000000, 1100000101001)=3

Because the affinity between QDFF and QDFZN is smaller than that between QDFF and QDFZCRN, the preferred SFF class is QDFZN for QDFF class. In fact, QDFZN is QDFF's native scan class.

In accordance with the embodiments of the present invention, the affinity approach may also be used to describe the closeness between two SFF classes or between two FF classes, which may be used in other optimization steps such as logic optimization and incremental optimization. Furthermore, this step may be performed at the library compilation stage once and for all. Then, later in the DFT analysis step, a lookup table may be consulted to retrieve the SFF class information.

In accordance with an alternate embodiment of the present invention, when one output pin (for instance, DOI) is floating in an actual circuit connection, the user may want to map into an SFF cell without corresponding pin. For instance, given FF cell DFFN with pin CK, DI, DO, DOI and an instantiation of DFFN where the DOI is floating, the user may want it to map into QDFZN with pin CK, DI, DO, TE, TI instead of DFZN with pin CK, DI, DO, DOI, TE, TI. In this case, the encoding of DFFN is modified to put 0 on the DOI bit, which is the case where DOI does not exist. Similarly, input pin connecting to constant logic value may be treated like a floating pin and skipped in affinity computation. This embodiment factors in how a cell is instantiated in the circuit and cannot be pre-computed, and must be considered on the fly during the scan cell replacement process.

In accordance with a further alternate embodiment, a weight may be attached to each attribute to indicate preference of one type of scan cell compared to another type of scan cell. Here, the weighted affinity may be determined as follows:

$$\text{Affinity (cell1, cell2)} = \Sigma w_i * c1_i - \Sigma w_i * c2_i$$

where $w_i$ is the weight associated with attribute i, $c1_i$ is the code of cell1 of attribute i and $c2_i$ is the code of cell2 of attribute i.

For example, given FF cell DFFN with pin CK, DI, DO, DOI, candidate SFF cells QDFZN with pin CK, DI, DO, TE, TI and DFZCRN with pin CK, DI, DO, DOI, SR, TE, TI, it will be found that DFFN has the same affinity to QDFZN as to DFZCRN. However, if a larger weight is assigned to the DOI than the weight to the SR, then QDFZN will be chosen over DFZCRN.

Referring back to FIG. 12, as the SFF class may have multiple scan cells available, as discussed above, at step 1204 the SFF cell whose timing characteristics most closely matching that of the given FF cell is determined. It should be noted that the affinity in this context is with respect to the cell, and not the class. Indeed, if the timing characteristics of the SFF cell that mostly closely matches the timing characteristics of the FF cell is dynamic timing, then the dynamic timing characterization is selected at step 1206. On the other than, if the timing characteristics of the SFF cell that mostly closely matching the timing characteristics of the FF cell is static timing, then the static timing characterization is selected at step 1205.

More specifically, in the static approach, the SFF cell whose timing characteristics is closest to the given FF cell is chosen based on library cell timing data. There are a lot of timing information stored in the library for each cell in the form of timing arcs. Timing arcs can be categorized into two types: constraints and delays. The constraint type timing arc describes the timing constraints between pins, while the delay type timing arc describes the delay between two pins.

In the static approach, the constraint type timing arcs are not considered. Only delay arc from clock pin to the DO and DOI pins are considered. In fact, this results in considering only the inherent delay within the cell itself and using this inherent delay as the timing characteristics to measure the cells.

One advantage of the static approach is that it can also be done at the library compilation stage. Combined with the affinity-based class selection, a quick lookup in the table can determine what SFF cell can be put in place of the given FF cell, resulting significant speedup in scan cell replacement. It also ensures uniform scan cell replacement, where the same FF cell will always be replaced with the same SFF cell.

For a library that has characterized the cells adequately; the static approach will produce an output scan-replaced netlist that has very close timing performance compared with the input non-scan netlist.

When the input non-scan netlist's timing performance is not up to the expectation, the dynamic approach may improve the performance by considering the cell delay and context delay (including for example, including transition delay and connection delay and so on). As such, in the dynamic approach, all timing arcs are considered for the cells. In addition, the input transition time and output load are also considered. A timing analysis is performed to extract the timing information from all data input pins, all synchronous input pins to DO/DOI for the FF cell. Then for each SFF cell in the chosen class, the same timing information is also computed. The one with the closest timing information is chosen as the SFF cell to replace the original FF cell.

The difference between the dynamic approach and the static approach is that the same FF cell always maps to the same SFF cell in the static approach, while in dynamic approach, the mapping is context sensitive, that is, the same FF cell may map to different SFF cells.

In the manner described above, in accordance with various embodiments of the present invention, a DFT design partitioning and synthesis approach is provided to apply a static timing analysis (STA) enhanced DFT analysis which greatly reduces the run time for DFT analysis without losing the comprehensiveness of DFT rule checking. Additionally, an affinity based scan replacement mechanism is provided in accordance with the various embodiments of the present invention to transform a non-scan design into a scan design for DFT with respect to the original design constraints, including power, timing and area specification.

Accordingly, by incorporating the STA enhanced DFT analysis with the affinity based scan replacement in accordance with the various embodiments of the present invention, an improved design flow with DFT may be achieved in the early stage of the design process. Moreover, IC designers are able to explore many different DFT implementation styles, including number of scan chains, different test-mode clocking mechanism, ordering of scan chains, for example, which enables a fast DFT prototyping design flow. Indeed, the various embodiments of the present invention enables the DFT design flow to be no longer an undesirable time consuming back end process.

The various processes described above including the processes operating in the software application execution environment in the STA enhanced DFT analysis approach with affinity based scan replacement techniques described in conjunction with FIGS. 7–12, may be embodied as computer programs developed using computer language that allows the modeling of complex systems with modular objects to create abstractions that are representative of real world, physical objects and their interrelationships. The software required to carry out the inventive process, which may be stored in a memory of the signal system 100, may be developed by a person of ordinary skill in the art and may include one or more computer program products.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A computer implemented process of performing design for testability analysis and synthesis in an integrated circuit design, comprising steps of:
    partitioning each logic block in an integrated circuit design based on one or more boundaries of multi-cycle initial setup sequence;
    excluding one or more partitioned logic blocks with the multi-cycle initial setup sequence from valid candidate blocks;
    selecting a constraint setting set;
    applying the constraint setting set to the integrated circuit design; and
    performing a design for testability analysis and synthesis on the valid candidate blocks.

2. The computer implemented process of claim 1 wherein the steps of selecting and applying the constraint setting set includes:
    extracting a subset of constraint settings from the selected constraint setting set; and
    applying the extracted subset of constraint settings to the integrated circuit design.

3. The computer implemented process of claim 1 wherein the step of performing design for testability analysis and synthesis includes performing Static Timing Analysis (STA) based design for testability analysis and synthesis on the valid candidate blocks.

4. The computer implemented process of claim 1 wherein the step of partitioning includes:
    for each logic block in the integrated circuit design,
        determining whether the logic block includes a multi-cycle initial setup sequence;
        including the logic block in the valid candidate blocks if the logic block does not include a multi-cycle initial setup sequence, and if the logic block includes the multi-cycle initial setup sequence, determining whether design partition is allowed between the logic block and other logic blocks in the integrated circuit design; and
        excluding the logic block in the valid candidate blocks if the design partition is allowed, otherwise, if the design partition is not allowed, including the logic block from the valid candidate blocks.

5. The computer implemented process of claim 4 wherein when it is determined that the design partition is allowed, extracting and storing one or more internal or external fan in constraints and affected fanout object values.

6. The computer implemented process of claim 4 wherein when it is determined that the design partition is not allowed, collecting affected fanout object values when the logic block is in a stable test mode state after the multi-cycle initial setup sequence.

7. The computer implemented process of claim 1 wherein the step of selecting the constraint setting set includes selecting one of only external object constraint setting being allowed, only internal object constraint setting being allowed, and both internal and external object constraint settings being allowed.

8. The computer implemented process of claim 1 wherein the applying step further includes a step of initiating the integrated circuit design to enter a stable test mode state with the multi-cycle initial setup sequence.

9. A computer implemented process for performing class and cell selection procedure in scan cell replacement for an integrated circuit design, comprising steps of:
    encoding a cell to be replaced with a corresponding scan cell;
    encoding the corresponding scan cell;
    determining a cost function between the encoded cell and the encoded corresponding scan cell; and
    establishing an affinity between the cell and the corresponding scan cell based on the cost function.

10. The computer implemented process of claim 9 wherein the steps of determining the cost function and establishing the affinity include:
    determining a Hamming distance between the encoded cell and the encoded corresponding scan cell; and
    establishing an affinity between the cell and the corresponding scan cell based on the determined Hamming distance.

11. The computer implemented process of claim 9 wherein the corresponding scan cell includes a dual scan cell, and further, wherein the cell includes a scan cell to which the dual scan cell corresponds.

12. A computer implemented process for performing scan cell replacement for an integrated circuit design, comprising steps of:
performing class selection from a cell library and a gate-level netlist based on affinity between cells;
determining a target characterization for the scan cell replacement; and
replacing one or more of the cells with corresponding one or more scan cells having the closest target characteristics.

13. The computer implemented process of claim 12 wherein the closest target characteristics include one or more of timing, area, power and/or other metrics.

14. The computer implemented process of claim 12 wherein the closest target characteristics include timing-based metrics.

15. The computer implemented process of claim 14 wherein the step of determining the target characterization includes selecting one of a static timing characterization and a dynamic timing characterization.

16. The computer implemented process of claim 15 wherein when the static timing characterization is selected, a scan cell with timing characteristics that is closest to a corresponding cell is selected based on library cell timing data.

17. The computer implemented process of claim 15 wherein the dynamic timing characterization includes one or more of cell delay and context delay, wherein the context delay includes transition delay and connection delay.

18. The computer implemented process of claim 16 wherein the library cell timing data includes one or more of a constraint type timing arc and a delay type timing arc.

19. The computer implemented process of claim 18 wherein the constraint type timing arc corresponds to timing constraints between pins, and further, wherein the delay type timing arc corresponds to timing delay between two pins.

20. A computer implemented process of performing design for testability analysis and synthesis in an integrated circuit design, comprising steps of:
partitioning each logic block in an integrated circuit design based on one or more boundaries of multi-cycle initial setup sequence;
excluding the one or more logic blocks with multi-cycle initial setup sequence from valid candidate blocks;
selecting a constraint setting set;
applying the constraint setting set to the integrated circuit design;
performing design for testability analysis and synthesis on the valid candidate blocks; and
performing affinity-based scan cell replacement.

21. The computer implemented process of claim 20 wherein the steps of selecting and applying the constraint setting set include:
extracting a subset of constraint settings from the selected constraint setting set; and
applying the extracted subset of constraint settings to the integrated circuit design.

22. The process of claim 20 wherein the step of performing scan cell replacement includes steps of:
performing class selection from a cell library and a gate-level netlist based on affinity between cells;
determining a target characterization for the scan cell replacement; and
replacing one or more of the cells with a corresponding one or more scan cells having the closest target characteristics.

23. The computer implemented process of claim 22 wherein the closest target characteristics include one or more of timing, area, power and/or other metrics.

24. The computer implemented process of claim 22 wherein the closest target characteristics include timing-based metrics.

25. The computer implemented process of claim 20 wherein the step of partitioning includes:
for each logic block in the integrated circuit design,
determining whether the logic block includes a multi-cycle initial setup sequence;
including the logic block in the valid candidate blocks if the logic block does not include the multi-cycle initial setup sequence, and if the logic block includes the multi-cycle initial setup sequence, determining whether design partition is allowed between the logic block and other logic blocks in the integrated circuit design; and
excluding the logic block in the valid candidate blocks if the design partition is allowed, otherwise, if the design partition is not allowed, including the logic block from the valid candidate blocks.

26. The computer implemented process of claim 20 wherein the step of selecting the constraint setting set includes selecting one of only external object constraint setting being allowed, only internal object constraint setting being allowed, and both internal and external object constraint settings being allowed.

27. The computer implemented process of claim 20 wherein the applying step further includes a step of initiating the integrated circuit design to enter a stable test mode state with the multi-cycle initial setup sequence.

28. A computer program product, comprising:
a medium readable by a computer, the computer readable medium having computer program code adapted to:
partition each logic block in an integrated circuit design based on one or more boundaries of multi-cycle initial setup sequence;
exclude one or more partitioned logic blocks with the multi-cycle initial setup sequence from valid candidate blocks;
select a constraint setting set;
apply the constraint setting set to the integrated circuit design; and
perform design for testability analysis and synthesis on the valid candidate blocks.

29. The computer program product of claim 28, wherein the computer program code adapted to select and to apply the constraint setting is further adapted to:
extract a subset of constraint settings from the selected constraint set; and
apply the extracted subset of constraint settings to the integrated circuit design.

30. The computer program product of claim 28, wherein the computer program code is further adapted to perform affinity-based scan cell replacement.

* * * * *